United States Patent [19]
Gavrilovic et al.

[11] Patent Number: 5,280,534
[45] Date of Patent: Jan. 18, 1994

[54] TUNABLE SOLID STATE CRYSTALLINE LASER MATERIAL

[75] Inventors: Pavle Gavrilovic, Brockton; Shobha Singh, Weston, both of Mass.

[73] Assignee: Polaroid Corporation, Cambridge, Mass.

[21] Appl. No.: 22,483

[22] Filed: Feb. 25, 1993

[51] Int. Cl.$^5$ .............................................. H01S 3/10
[52] U.S. Cl. ...................................... 372/20; 372/41; 372/66
[58] Field of Search ................................ 372/20, 41, 66

[56] References Cited
U.S. PATENT DOCUMENTS 3,617,937  11/1971  Mazelsky et al. ..................... 372/41

*Primary Examiner*—Leon Scott, Jr.
*Attorney, Agent, or Firm*—Edward S. Roman; Robert A. Sabourin

[57] ABSTRACT

A crystalline material for use in a solid state tunable laser is YAG:Mn wherein the Mn is predominantly trivalent. The laser is tunable in the yellow-orange range (0.59–0.63 μm) and the near infrared range (1.04–1.2 μm).

9 Claims, 5 Drawing Sheets

FIG. I

TUNABLE SOLID STATE CRYSTALLINE LASER MATERIAL

BACKGROUND OF THE INVENTION

The invention relates to tunable lasers. In particular, the invention relates to a crystalline material for a tunable solid state laser formed of a yttrium aluminum garnet (YAG) host and a trivalent manganese dopant.

It is known that transition metal ions in insulating crystal hosts support lasing. Indeed, the first laser to be demonstrated, namely ruby, is an example of a $Cr^{3+}$ ion in an $Al_2O_3$ host. More recently, a system incorporating $Ti^{3+}:Al_2O_3$ (Ti:sapphire) has received much attention and has been developed into a widely tunable laser covering the wavelength range from 0.69 to 1.1 $\mu$m. The other major category of solid-state lasers is based on a yttrium aluminum garnet (YAG) host doped with rare earth ions, most notably Nd:YAG. In contrast to many transition-metal solid-state lasers, rare earth lasers are not widely tunable.

The luminescence properties of divalent manganese have been investigated extensively, particularly in $MnF_2$, which has been used as a host for other transition-metal ions, but data on trivalent and higher oxidation states of manganese in insulating crystals are very scarce.

Of all commercially successful solid-state lasers, the shortest-wavelength operation is achieved in Ti:sapphire at the red edge of the visible spectrum, 0.69 $\mu$m. Currently there are no tunable solid state lasers operative in the yellow-orange spectral range (0.59–0.63 $\mu$m). These wavelengths are not covered by existing tunable lasers, except for dye lasers in the visible. Solid-state lasers are more desirable sources because of their high output power, reliability and ease of operation. The YAG host material has the advantage that it is the most highly developed laser crystal available. The crystal growth of YAG has reached a highly sophisticated stage, with large-diameter crystals of good optical quality being commercially available. The thermal conductivity and fracture strength of YAG are high, making it an ideal host for high output lasers.

It is an object of the present invention to provide a tunable solid state laser suitable for broad band operation in selected wavelengths of interest.

SUMMARY OF THE INVENTION

The present invention is based upon the discovery that trivalent manganese ($Mn^{3+}$) when incorporated in a yttrium aluminum garnet (YAG) host provides a low threshold or continuous wave (CW) crystalline lasing material operative in yellow-orange range from about 0.59 to about 0.63 $\mu$m and the near infrared range from about 1.04 to about 1.2 $\mu$m.

In a particular embodiment, the invention comprises a crystalline material for use in a solid state laser comprising a YAG host material and a trivalent manganese dopant present in an amount ranging from about 0.05 to about 5 atomic percent.

The invention is also directed to a method for manufacture of a crystalline material for use in a solid state laser in which YAG:Mn is melted in an oxygen rich or inert atmosphere for a time sufficient to result in crystal growth. The melt is cooled and subjected to a post growth annealing in a reducing atmosphere for a time sufficient to result in the valency conversion of about 75% or greater of Mn to $Mn^{3+}$.

DESCRIPTION OF THE INVENTION

The invention is directed to a crystalline material for use in a tunable solid state laser employing a yttrium aluminum garnet (YAG) host and a trivalent manganese ($Mn^{3+}$) dopant. In a particular embodiment, the invention comprises a crystalline YAG:$Mn^{3+}$ system which is tunable in the yellow-orange wavelength range from about 0.59 to about 0.63 $\mu$m (5900–6300 Å) and the near infrared wavelength range from about 1.04 to about 1.2 $\mu$m (10,400–12,000 Å). Both ranges, particularly the lower range, extend over a relatively broad band within which the laser output may be tuned for precise and selective operation. Also, the absorption spectrum of the $Mn^{3+}$ dopant does not overlap with the emission spectrum, so that laser performance is not degraded by absorption of the laser output.

YAG:Mn crystals can be prepared by either a flux process or pulled from a melt by the Czochralski method. The crystals used for this study were grown from a flux. The starting materials were $Y_2O_3$ and $Al_2O_3$ in the proper stoichiometric ratio for $Y_3Al_5O_{12}$ (YAG), with the addition of one percent (1%) $Mn_2O_3$. The mixture was melted in a flux consisting of PbO, $PbF_2$ and $B_2O_3$. The melt was contained in a covered platinum crucible. After holding the melt at 1300° C. for twelve hours, it was cooled to ~800° C. at a rate of 0.5° C. per hour. The flux was then poured out at that temperature and cooled to room temperature. The crystals were washed with $HF+HNO_3$ to remove the remaining solidified flux. The resulting crystallites were roughly ellipsoidal in shape with a maximum major axis length of about 1 cm and minor axis length of about 0.5 cm. A range of Mn concentrations was obtained in one growth run due to the high distribution coefficient. The Mn concentration was measured by electron-probe microanalysis of polished samples. Absorption and fluorescence spectra were measured using polished crystals approximately 1.5 mm in thickness. Similar spectroscopic data were obtained on Czochralski-grown YAG:Mn, Nd crystals, but in order to simplify the interpretation of data, the results obtained with the flux-grown material which contains no neodymium are discussed herein.

Figure 1:
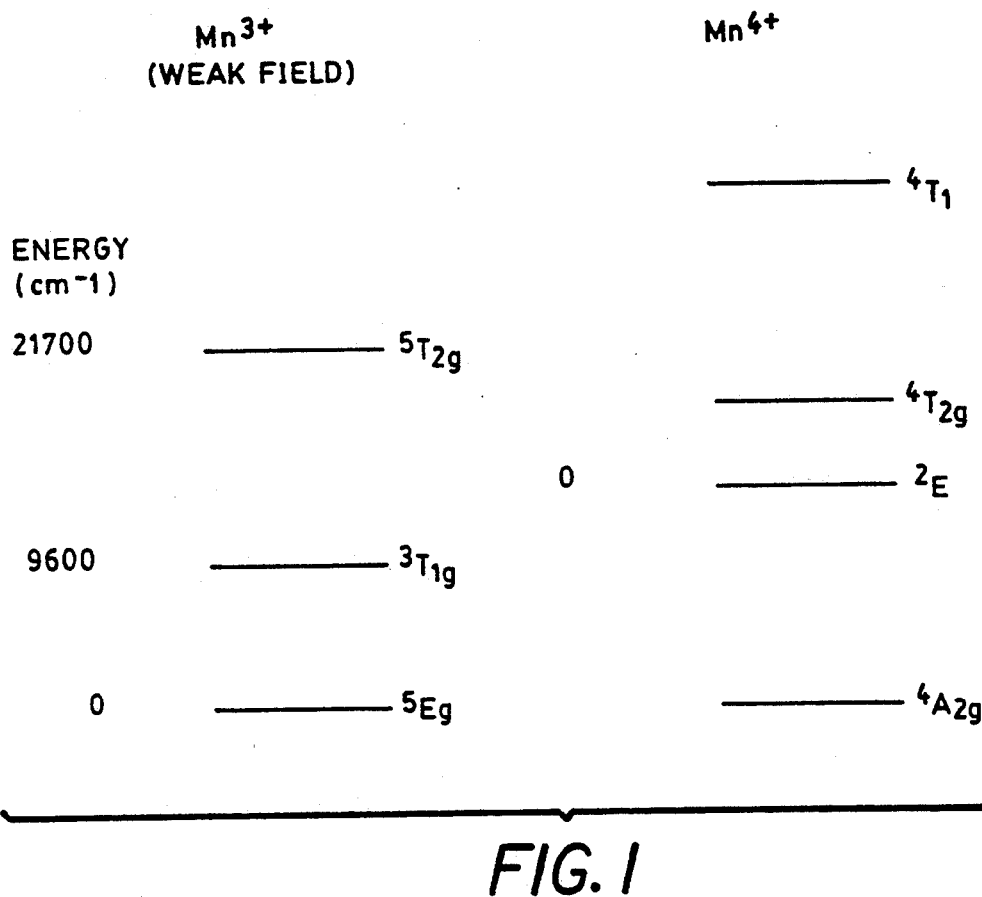
FIG. 1 is a theoretical energy level diagram of $Mn^{3+}$ and $Mn^{4+}$ in an octahedral crystal field.

The manganese ion can exist in several oxidation states in garnets. In YAG crystals grown in an oxidizing or inert atmosphere, it is likely that Mn is incorporated as $Mn^{4+}$ as well as $Mn^{3+}$. It is thus necessary to know the electronic structure of both ions in order to interpret spectroscopic data obtained on experimental samples. The theoretical energy level diagram for $Mn^{3+}$ and $Mn^{4+}$ in an octahedral site (sixfold coordination) is shown in FIG. 1. On the basis of these electronic structures, trivalent manganese will be expected to have a single parity-allowed absorption band due to the $^5E_g$–$^5T_{2g}$ transition ($^5E_g$–$^3T_{1g}$ is not parity allowed), whereas the tetravalent ion will have two parity-allowed absorption bands due to the $^4A_{2g}$–$^4T_{2g}$ and $^4A_{2g}$–$^4T_1$ transitions.

Figure 2:
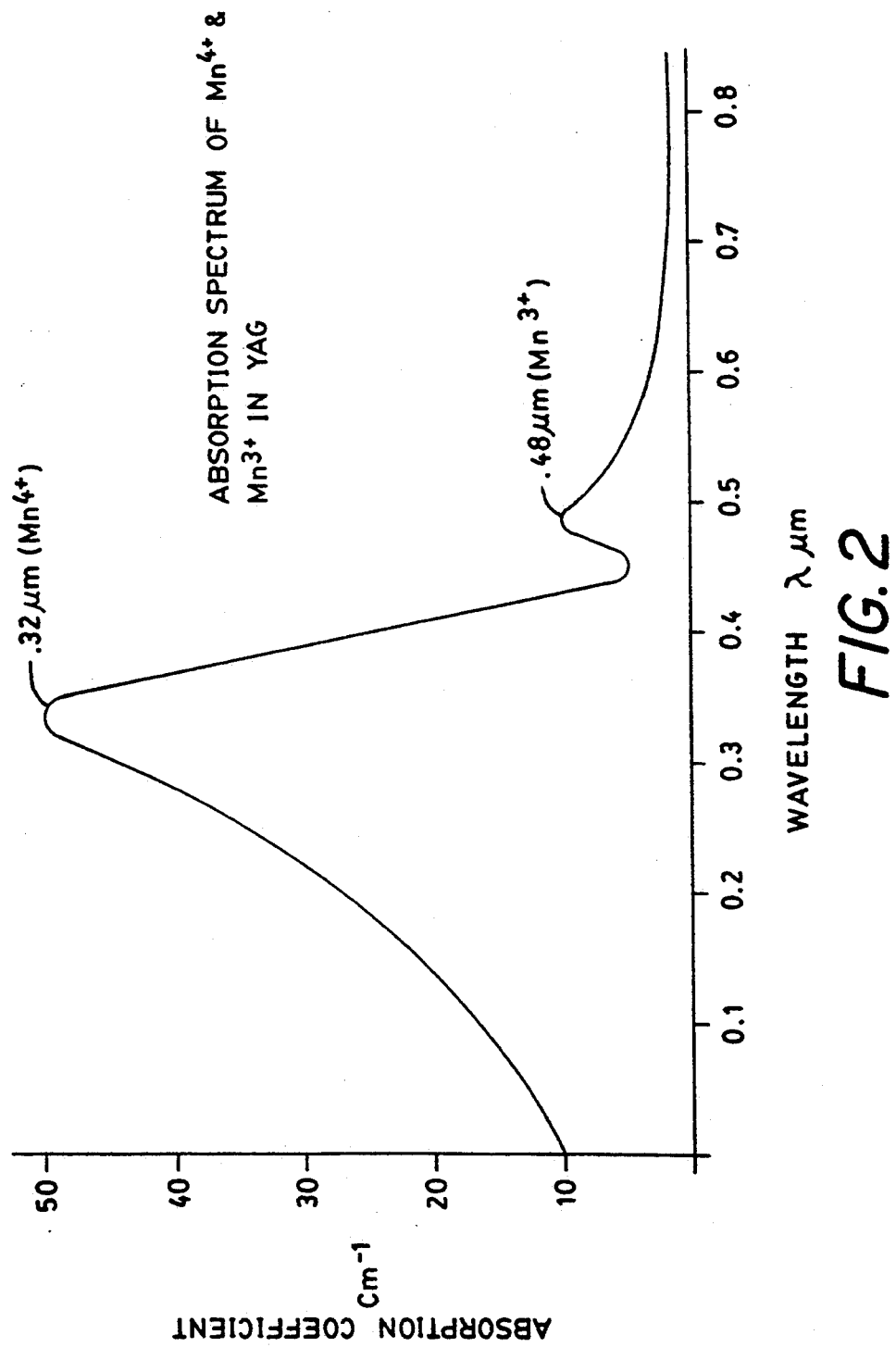
FIG. 2 is the absorption spectrum of flux-grown YAG:Mn from 2500 to 8000 Å showing absorption peaks for $Mn^{3+}$ and $Mn^{4+}$.
Figure 3:
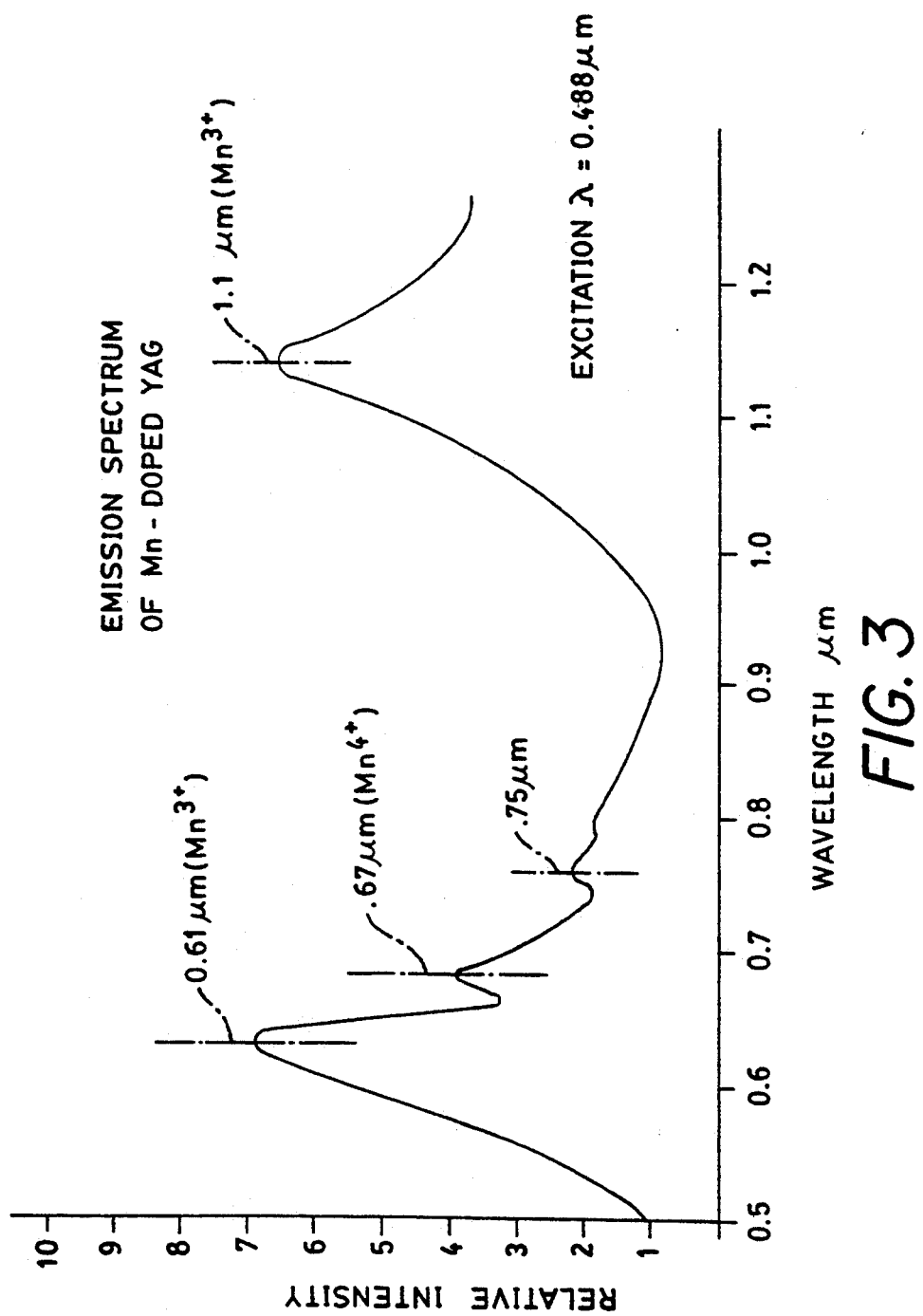
FIG. 3 is a fluorescence spectrum for flux-grown YAG:Mn containing $Mn^{3+}$ and $Mn^{4+}$ from about 0.5 to about 1.2 $\mu$m, with different emission wavelengths noted, and excitation at 0.488 $\mu$m.
Figure 4:
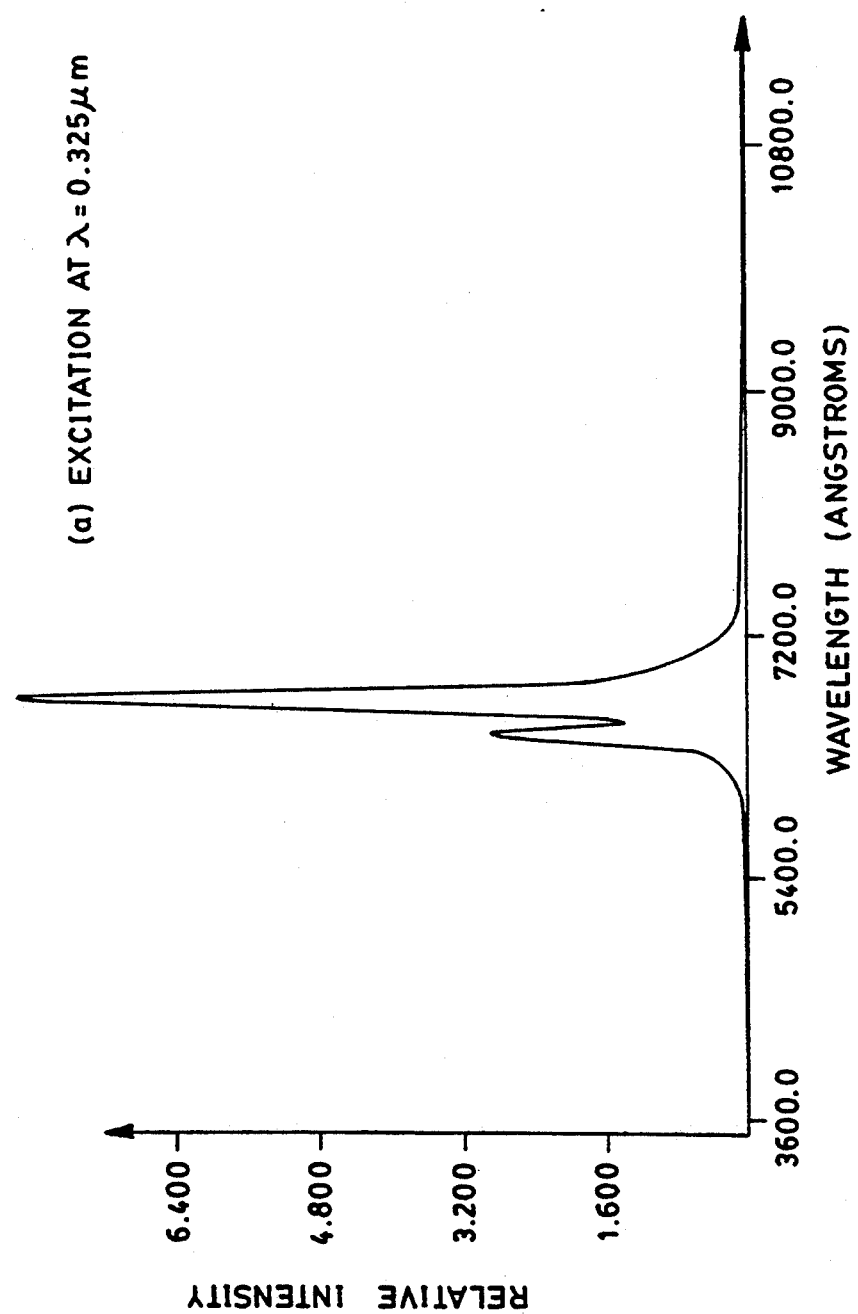
FIG. 4 shows the fluorescence with UV excitation at 0.325 $\mu$m.

FIG. 2 shows the optical absorption spectrum of a crystal containing 0.35 at % Mn. FIG. 3 is the emission spectrum for the grown material for an excitation wavelength of 0.488 μm. FIG. 4 shows the fluorescence with UV excitation at 0.325 μm. From a comparison of FIGS. 2 and 3 the strong absorption band at 0.32 μm is identified with tetravalent manganese. The 0.48 μm absorption band is due to trivalent manganese. From FIGS. 2, 3 we conclude that the grown crystals contain both $Mn^{3+}$ and $Mn^{4+}$. For example, when luminescence was excited by pumping into the ultraviolet absorption band with a CW He-Cd laser ($\lambda = 0.325$ μm) the emission spectrum (FIG. 4) shows two relatively narrow bands at 0.64 and 0.67 μm. Pumping into the blue absorption band at 0.488 μm with $Ar^+$ laser light results in much broader emission band peaks at 0.61, 0.75, and 1.1 μm (FIG. 3). There is some emission superimposed from $Mn^{4+}$ at 0.6730 μm, which may be attributed to absorption of the 0.488 μm pump light in the long-wavelength end of the UV absorption.

The broad emission band 1.04–1.2 μm (centered at 1.1 μm) is identified with a parity-forbidden transition between the $^5T_{2g}$ and $^3T_{1g}$ levels of $Mn^{3+}$. Trivalent manganese is a four-level system, because the terminal state of $Mn^{3+}$ is far above the ground state. It is, thus, most likely to produce a CW laser. The spectral width of the emission band indicates that lasing should be tunable over a range of at least about 0.12 μm. Another important spectral feature is that trivalent manganese laser material can be pumped, outside of the emission bands, by the blue and green lines of high-power $Ar^+$ lasers, similar to Ti:sapphire.

In FIG. 3, the visible fluorescence peaking at 0.61 μm is identified as a transition from $^5T_{2g}$ to vibronic levels associated with the ground state. The energy difference or Stokes shift between absorption energy and emission energy is about 4300 $cm^{-1}$ and is comparable to that observed for $Ti^{3+}$ in $Al_2O_3$. Similarly, it is reasonable to expect that the emission cross section for this transition can be quite high, leading to low-threshold visible lasers.

The absorption and emission cross sections of transition elements are about an order of magnitude higher than those of the rare earths. This general rule is confirmed by measurements of the absorption cross section in the grown samples. The peak absorption cross section at 0.48 μm is $2.4 \times 10^{-18}$ $cm^2$. This number is calculated on the assumption that the trivalent Mn ion concentration is equal to the atomic concentration measured by an electron microprobe, and thus is a lower limit on the true cross section.

The spectroscopic data show that $Mn^{3+}$ doped YAG may be used as a gain medium for tunable lasers in the near infrared and in the yellow-orange regions of the visible spectrum. It can be pumped by an Ar-ion laser, similar to the highly successful Ti:sapphire tunable laser. The low self-absorption in regions of fluorescence means that low-threshold operation may be achievable. It may also be possible to convert most if not substantially all $Mn^{4+}$ incorporated into the crystal into $Mn^{3+}$ through annealing in a reducing atmosphere, e.g., $H_2$.

Figure 5:
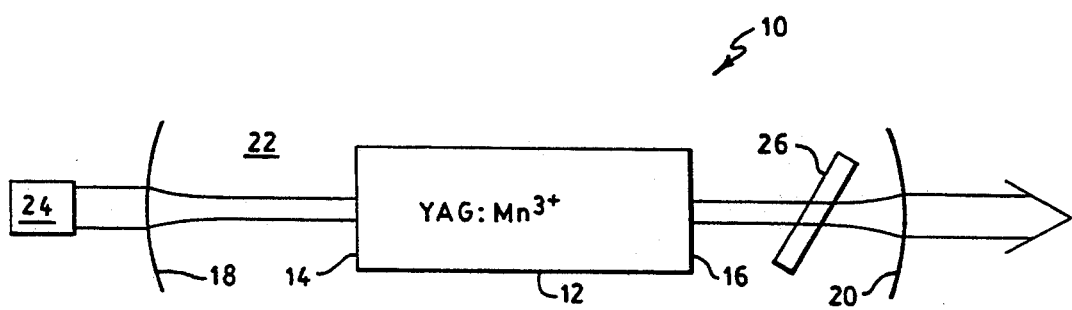
FIG. 5 is a schematic illustration of a tunable laser cavity.

The laser material of the invention is employed in an optically pumped tunable laser 10 (FIG. 5) containing a crystal 12 formed of yttrium aluminum garnet doped with trivalent manganese (YAG:$Mn^{3+}$) as the active element. In the embodiment, the YAG crystal 12 has two plane-parallel polished facets 14 and 16 that are antireflection coated at wavelengths centered at 0.61 and 1.1 μm. The crystal 12 is located between two concave mirrors 18 and 20, forming a linear resonator 22. One mirror 18 has a high reflectivity over the whole lasing band, and the other mirror 20 is a partial reflector in the lasing band. An argon-ion laser 24 emitting at 0.488 μm is used to pump the laser in an end pumped or collinear configuration. Wavelength selection is accomplished with a birefringent tuner 26 located inside the laser cavity, as is done in tunable Ti:sapphire lasers.

Alternatively, the resonator can be constructed monolithically (i.e. without mirrors 18 and 20) by depositing reflective coatings directly onto the crystal facets 14 and 16. In this case, the wavelength selection would be due to coating reflectivity variation. The crystal facets 14 and 16 can be curved in order to stabilize the lasing mode.

In other designs, the lasing crystal may be pumped by a flashlamp (not shown) instead of another laser. The resonator configuration may also be in the form of a ring instead of linear, and other intracavity elements, such as etalons, Q-switches, etc., may be included, which would be familiar to those skilled in the art.

In an exemplary embodiment, the YAG:$Mn^{3+}$ material contains Mn in an amount ranging from about 0.05 to about 5 atomic %, preferably from about 0.1 to about 5 atomic %. It is thought that an optimum Mn concentration is about 1%. The level of purity of the YAG is comparable to known commercially available YAG for the purposes required.

$Mn^{3+}$ is well accepted in YAG. In the formation of flux-grown YAG:Mn crystals, a major portion, e.g., 80% of the Mn is converted to trivalent manganese ($Mn^{3+}$) during post growth annealing in a reducing ($H_2$) atmosphere. The ratio of $Mn^{3+}$:$Mn^{4+}$ is believed to be 80:20 after an 8 hour post growth anneal at 1200°–1300° C. in 5–100% $H_2$. The ratio of $Mn^{3+}$:$Mn^{4+}$ may be determined by monitoring the fluorescence and absorption bands of each ion.

The present invention is advantageously adapted to provide broad band tunable lasing in two useful wavelength ranges beyond those available in conventional Ti:sapphire systems. The resulting solid state (crystalline) laser is capable of producing a high power density relative to dye lasers.

While there has been described what at present are considered to be the preferred embodiments of the present invention, it will be readily apparent to those skilled in the art that various changes and modifications may be made therein without departing from the invention and it is intended in the appended claims to cover such changes and modifications as fall within the true spirit and scope of the invention.

What is claimed is:

1. A crystalline lasing material for use in a tunable solid state laser said lasing material comprising:
    a yttrium aluminum garnet (YAG) host material and
        a trivalent manganese dopant ($Mn^{3+}$) which can operate to provide output wavelengths in one of a yellow-orange range of about 0.59 to 0.63 μm and a near-infrared range of about 1.04 to about 1.2 μm.

2. The crystalline lasing material of claim 1, wherein an amount of said $Mn^{3+}$ present in the YAG host material ranges from about 0.05 to about 5 atomic percent.

3. The crystalline lasing material of claim 2, wherein the amount of said $Mn^{3+}$ is about 1 atomic percent.

4. The crystalline lasing material of claim 1, wherein the $Mn^{3+}$ present in the YAG host material is derived from elemental manganese, which is at least about 80 percent trivalent manganese and about 20 percent tetravalent manganese.

5. The crystalline lasing material of claim 1, having an absorption band centered around 0.48 μm.

6. A method for manufacturing a crystalline lasing material for use in a tunable solid state laser, said method comprising the steps of:
  growing a crystal in an oxidizing or inert atmosphere, said crystal comprising a yttrium aluminum garnet host material and a trivalent manganese dopant ($Mn^{3+}$); and
  post-growth annealing the crystal in a reducing atmosphere to produce said crystal comprising a majority of said trivalent manganese dopant which can operate to provide output wavelengths in one of a yellow-orange range of about 0.59 to about 0.63 μm and a near-infrared range of about 1.04 to about 1.2 μm.

7. The method of claim 6, wherein the $Mn^{3+}$ is present in an amount ranging from about 0.1 to about 5 atomic percent.

8. The method of claim 6, wherein the $Mn^{3+}$ present in the host material is derived from elemental manganese, which is at least about 80 percent trivalent manganese and about 20 percent tetravalent manganese.

9. A tunable solid state crystalline laser comprising:
  a crystal comprising a yttrium aluminum garnet host material and a trivalent manganese dopant; and
  a tuner for tuning said crystal in one of a yellow-orange range of about 0.59 of about 0.63 μm and a near-infrared range of about 1.04 to about 1.2 μm.

* * * * *